United States Patent
Shen et al.

(10) Patent No.: US 11,672,100 B2
(45) Date of Patent: Jun. 6, 2023

(54) HEAT EQUALIZATION PLATE AND METHOD FOR MANUFACTURING THE SAME

(71) Applicants: Avary Holding (Shenzhen) Co., Limited., Shenzhen (CN); QING DING PRECISION ELECTRONICS (HUAIAN) CO.,LTD, Huai an (CN)

(72) Inventors: Fu-Yun Shen, Shenzhen (CN); Hsiao-Ting Hsu, New Taipei (TW); Ming-Jaan Ho, New Taipei (TW)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 265 days.

(21) Appl. No.: 17/112,423

(22) Filed: Dec. 4, 2020

(65) Prior Publication Data

US 2021/0161028 A1 May 27, 2021

Related U.S. Application Data

(63) Continuation-in-part of application No. PCT/CN2019/120971, filed on Nov. 26, 2019.

(51) Int. Cl.
*H05K 7/20* (2006.01)
*F28D 15/04* (2006.01)
(Continued)

(52) U.S. Cl.
CPC ....... *H05K 7/20336* (2013.01); *C25D 7/0678* (2013.01); *F28D 15/046* (2013.01);
(Continued)

(58) Field of Classification Search
CPC .... H05K 7/20336; F28D 15/046; C25D 7/00; C25D 7/0678; C25D 5/022; C25D 5/611;
(Continued)

(56) References Cited

U.S. PATENT DOCUMENTS 4,878,990 A * 11/1989 Dugan ................ H01L 21/4835
361/813
5,072,520 A * 12/1991 Nelson ................... H01R 12/52
29/877

(Continued)

FOREIGN PATENT DOCUMENTS

| CN | 104754926 A | 7/2015 |
| CN | 107809880 A | 3/2018 |
| TW | M586788 U | 11/2019 |

*Primary Examiner* — David P Bryant
*Assistant Examiner* — Christine Bersabal
(74) *Attorney, Agent, or Firm* — ScienBiziP, P.C.

(57) ABSTRACT

A heat equalization plate includes a first copper clad laminate including a first copper foil, a second copper clad laminate including a second copper foil, a connecting bump, a plurality of thermally conductive bumps, and a working fluid. The second copper foil faces the first copper foil. The connecting bump is formed on a surface of the first copper foil facing the second copper foil. The thermally conductive bumps are formed on a surface of the first copper foil facing the second copper foil. The connecting bump is an annulus and surrounds the thermally conductive bumps. The connecting bump is connected to the second copper foil to form a sealed chamber. The thermally conductive bumps are received in the sealed chamber. The working fluid is received in the sealed chamber. The present invention also needs to provide a method for manufacturing the heat equalization plate.

13 Claims, 10 Drawing Sheets

(51) Int. Cl.
*C25D 7/06* (2006.01)
*B32B 15/20* (2006.01)

(52) U.S. Cl.
CPC ........... *B32B 15/20* (2013.01); *B32B 2255/06* (2013.01); *B32B 2255/205* (2013.01); *B32B 2307/302* (2013.01); *B32B 2311/12* (2013.01)

(58) Field of Classification Search
CPC ............ B32B 2457/00; B32B 2311/12; B32B 2307/302; B32B 2307/538; B32B 2307/546; B32B 2307/732; B32B 2255/06; B32B 2255/205; B32B 2250/03; B32B 2250/40; B32B 27/32; B32B 27/28; B32B 27/36; B32B 27/38; B32B 27/281; B32B 15/20; B32B 15/085; B32B 15/09; B32B 15/08; B32B 15/092; B32B 3/30; B32B 3/08
See application file for complete search history.

(56) References Cited

U.S. PATENT DOCUMENTS

| | | | | |
|---|---|---|---|---|
| 5,776,824 | A | * | 7/1998 | Farnworth .......... H01L 21/4853 |
| | | | | 438/738 |
| 2002/0129894 | A1 | * | 9/2002 | Liu ......................... H01L 24/81 |
| | | | | 156/291 |
| 2006/0094226 | A1 | | 5/2006 | Huang et al. |
| 2012/0070684 | A1 | * | 3/2012 | Wang ....................... H05K 1/05 |
| | | | | 156/182 |
| 2020/0049422 | A1 | * | 2/2020 | Chikagawa ......... F28D 15/0233 |

* cited by examiner

HEAT EQUALIZATION PLATE AND METHOD FOR MANUFACTURING THE SAME

CROSS-REFERENCE TO RELATED APPLICATIONS

This application is a continuation-in-part under 35 U.S.C. § 120 of international patent application PCT/CN2019/120971 filed Nov. 26, 2019.

FIELD

The subject matter herein generally relates to a heat equalization plate and a method for manufacturing the same.

BACKGROUND

The electronic component generates a large amount of heat during the working process. If the heat is not released in time, it will accumulate inside the electronic component, causing the temperature of the electronic component to rise, affecting its performance, and even damaging the electronic component.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 1:
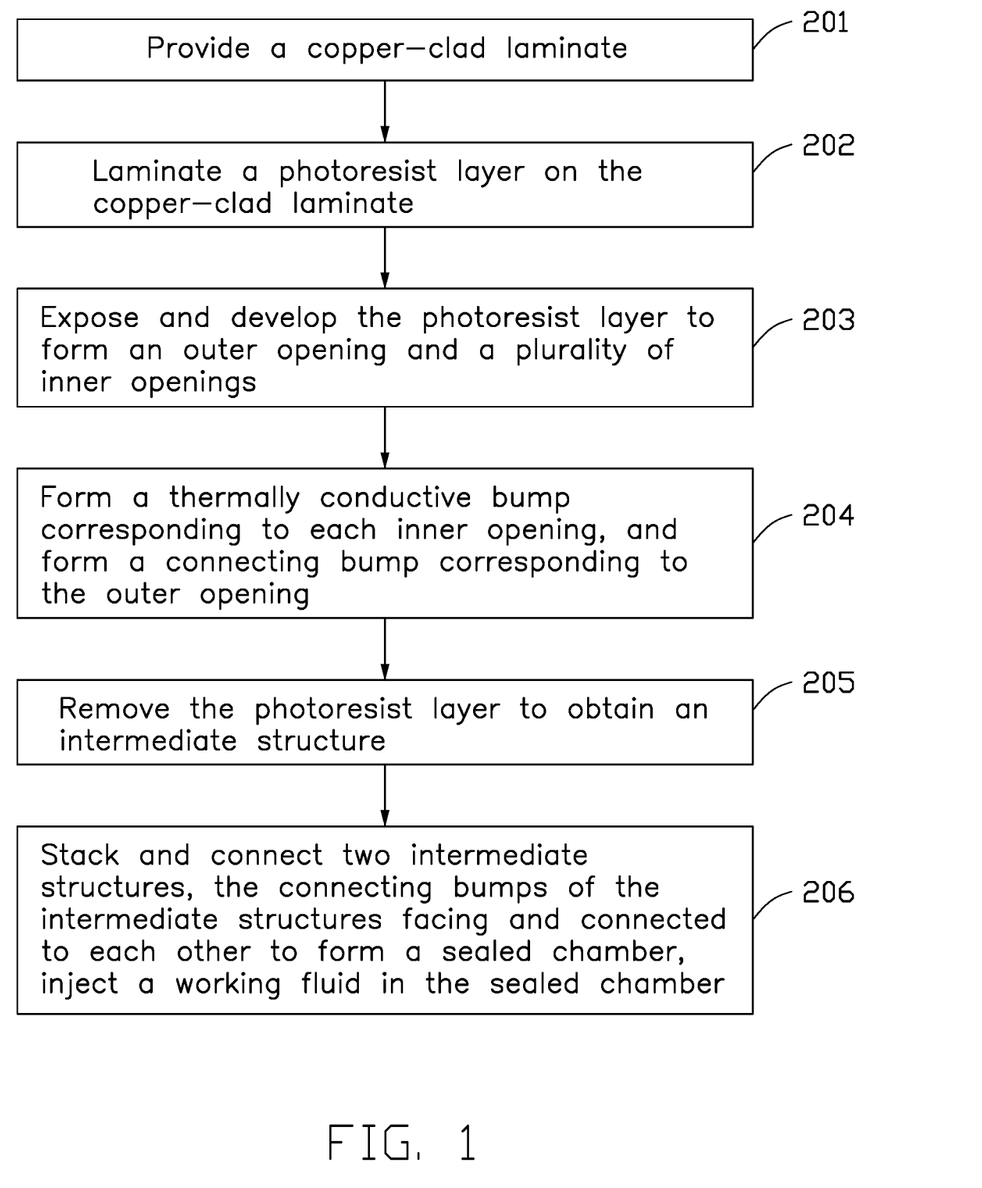
FIG. 1 is a flowchart of an embodiment of a method for manufacturing a heat equalization plate.

FIG. 1 illustrates a flowchart of a method in accordance with a first embodiment. The method for manufacturing a first heat equalization plate 50a (shown in FIG. 8) is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The method can begin at block 201.

Figure 2:
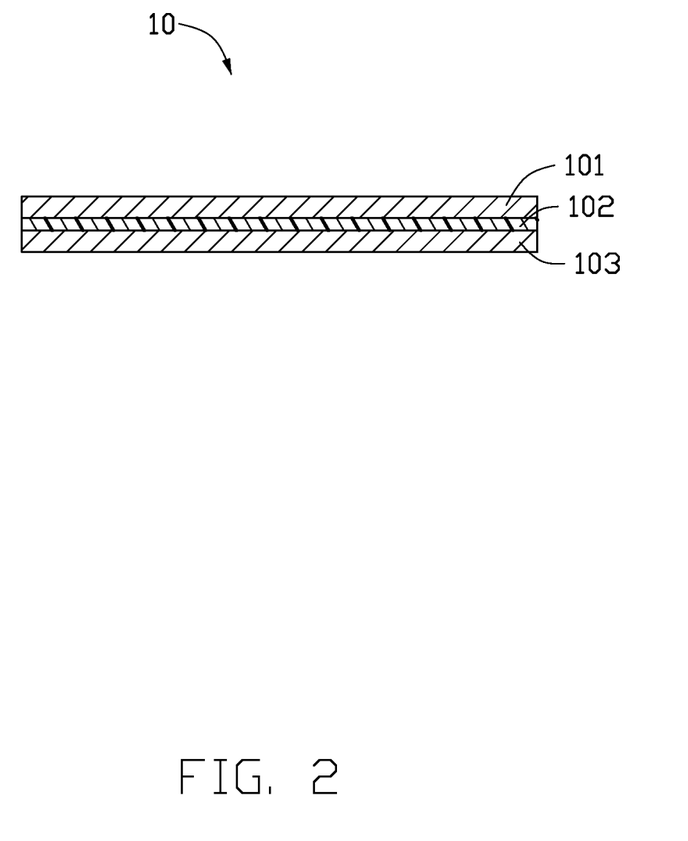
FIG. 2 is a cross-sectional view of an embodiment of a copper-clad laminate.

At block 201, referring to FIG. 2, a copper-clad laminate 10 is provided. The copper-clad laminate 10 may be a double-sided copper-clad laminate or single-sided copper-clad laminate. In the illustrated embodiment, the copper-clad laminate 10 is a double-sided copper-clad laminate including a first cooper foil 101, an insulating layer 102, and a second copper foil 103 stacked in orderly.

The insulating layer 102 may be made of a material selected from epoxy resin, polypropylene, polyphenylene oxide, polyimide, polyethylene terephthalate, or polyethylene naphthalate. In the illustrated embodiment, the copper-clad laminate 10 is a flexible copper-clad plate, and the insulating layer 102 is made of polyimide.

In at least one embodiment, a thickness of the insulating layer 102 is in a range of 5 μm to 50 μm. Preferably, the thickness of the insulating layer 102 is 12 μm.

Figure 3:
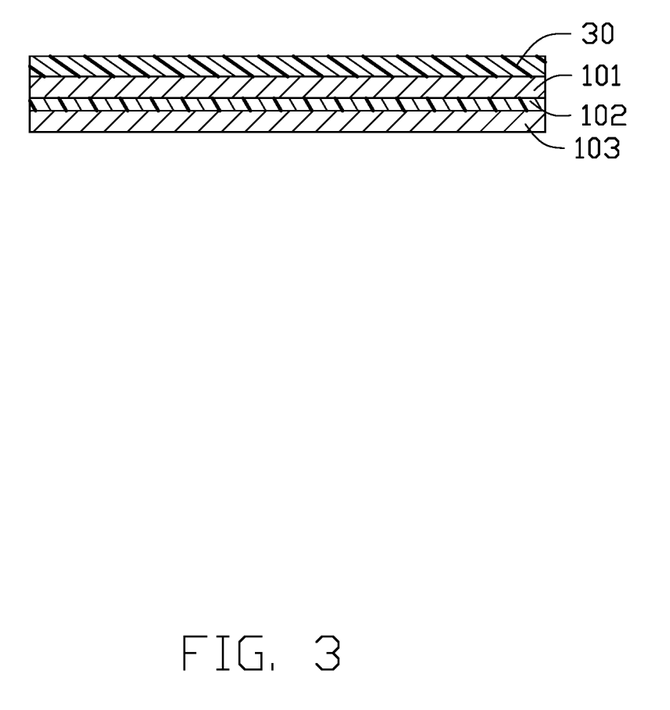
FIG. 3 is a cross-sectional view showing a photoresist layer on the copper-clad laminate of FIG. 2.

At block 202, referring to FIG. 3, a photoresist layer 30 is laminated on a side of the first copper foil 101 facing away from the second copper foil 103 to cover the first copper foil 101.

In at least one embodiment, a thickness of the photoresist layer 30 is in a range of 25 μm to 60 μm. Preferably, the thickness of the photoresist layer 30 is 40 μm.

Figure 4:
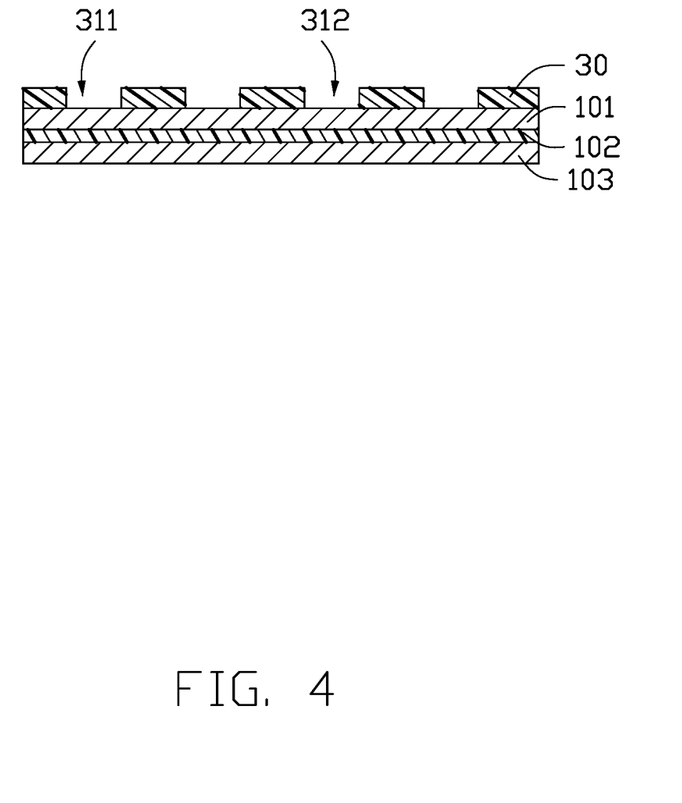
FIG. 4 is a cross-sectional view showing an outer opening and a plurality of inner openings formed on the photoresist layer of FIG. 3.

At block 203, referring to FIG. 4, the photoresist layer 30 is exposed and developed to form an outer opening 311 and a plurality of inner openings 312. The outer opening 311 surrounds the plurality of inner openings 312. A part of the first copper foil 101 is exposed from the outer opening 311 and the plurality of inner openings 312. The outer opening 311 is an annulus.

In at least one embodiment, the outer opening 311 may be a rectangular annulus. An inner side of the rectangular annulus has a length of 20 μm to 300 μm, and a width of 20 μm to 300 μm. Preferably, the length and the width of an inner side of the rectangular annulus are both 50 μm.

Figure 5:
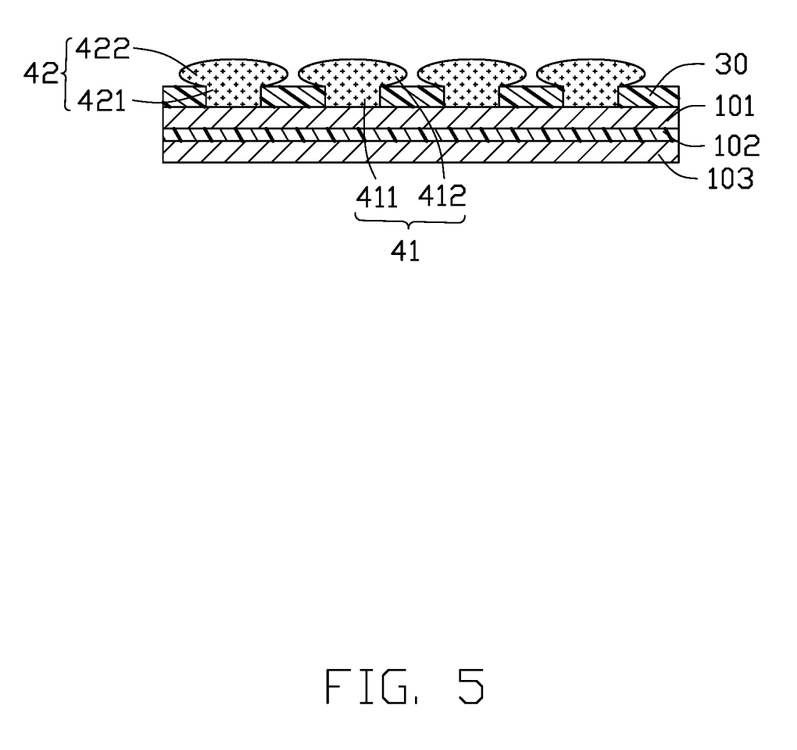
FIG. 5 is a cross-sectional view showing a plurality of thermally conductive bump and a connecting bump on the copper-clad laminate of FIG. 4.

At block 204, referring to FIG. 5, a thermally conductive bump 41 is formed in each of the plurality of inner openings 312 by electroplating, and a connecting bump 42 is formed in the outer opening 311 by electroplating. The connecting bump 42 surrounds a plurality of thermally conductive bumps 41.

Each of the plurality of thermally conductive bumps 41 includes a first body portion 411 and a first cover portion 412. The first body portion 411 fills in one of the plurality of inner openings 312, and is electrically connected to the first copper foil 101. The first cover portion 412 is arranged at a side of the photoresist layer 30 facing away from the copper-clad laminate 10 and electrically connected to a side of the first body portion 411 facing away from the first copper foil 101. A width of the first cover portion 412 is greater than a width of the first body portion 411 to cover the whole side of the first body portion 411 and a portion of the photoresist layer 30 around the first body portion 411.

The connecting bump 42 includes a second body portion 421 and a second cover portion 422. The second body portion 421 fills in the outer opening 311, and is electrically connected to the first copper foil 101. The second cover portion 422 is arranged at a side of the photoresist layer 30 facing away from the copper-clad laminate 10, and electrically connected to a side of the second body portion 421 facing away from the first copper foil 101. A width of the second cover portion 422 is greater than a width of the second body portion 421 to cover the whole side of the second body portion 421 and a portion of the photoresist layer 30 around the second body portion 421.

In at least one embodiment, referring to FIG. 5, the first body portion 411 and the second body portion 412 have the same height, and the first body portion 411 is flush with the photoresist layer 30. A height H1 of each of the first body portion 411 and the second body portion 412 is in a range of 25 μm to 60 μm. Preferably, the height H1 of each of the first body portion 411 and the second body portion 412 is 40 μm.

Figure 7:
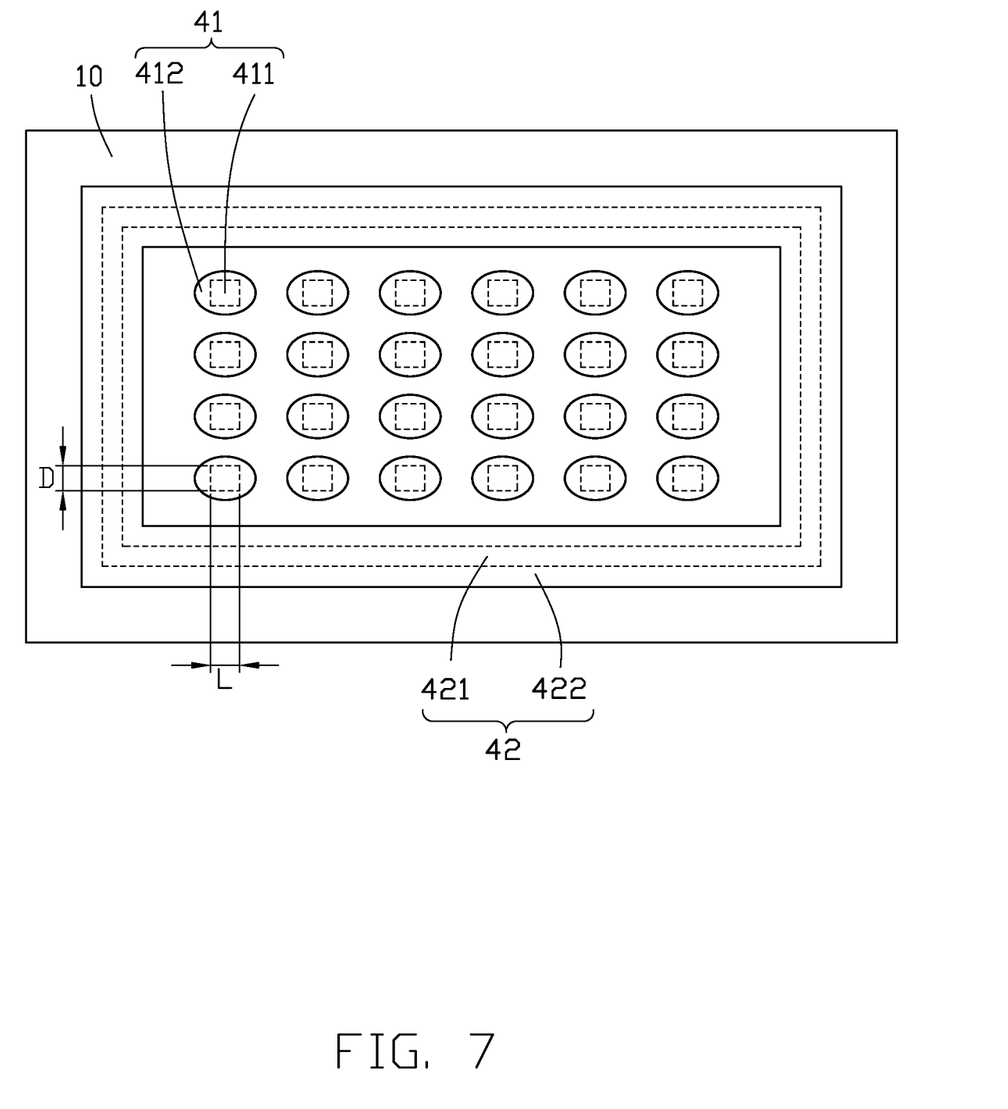
FIG. 7 is a top view of the intermediate structure of FIG. 6.

In at least one embodiment, referring to FIG. 7, the first body portion 411 may be a rectangular parallelepiped. A length L of a side of the first body portion 411 facing the first copper foil 101 is in a range of 20 μm to 300 μm, preferably 50 μm. A width D of the side of the first body portion 411 facing the first copper foil 101 is in a range of 20 μm to 300 μm, preferably 50 μm. In another embodiment, the first body portion 411 may be any shape such as a prismoid, a cylinder, or an elliptic cylinder.

In at least one embodiment, each of the plurality of thermally conductive bumps 41 and the connecting bump 42 may be made of copper. In another embodiment, each of the plurality of thermally conductive bumps 41 and the connecting bump 42 may be made of iron, silver, tin or other conductive metals.

Figure 6:
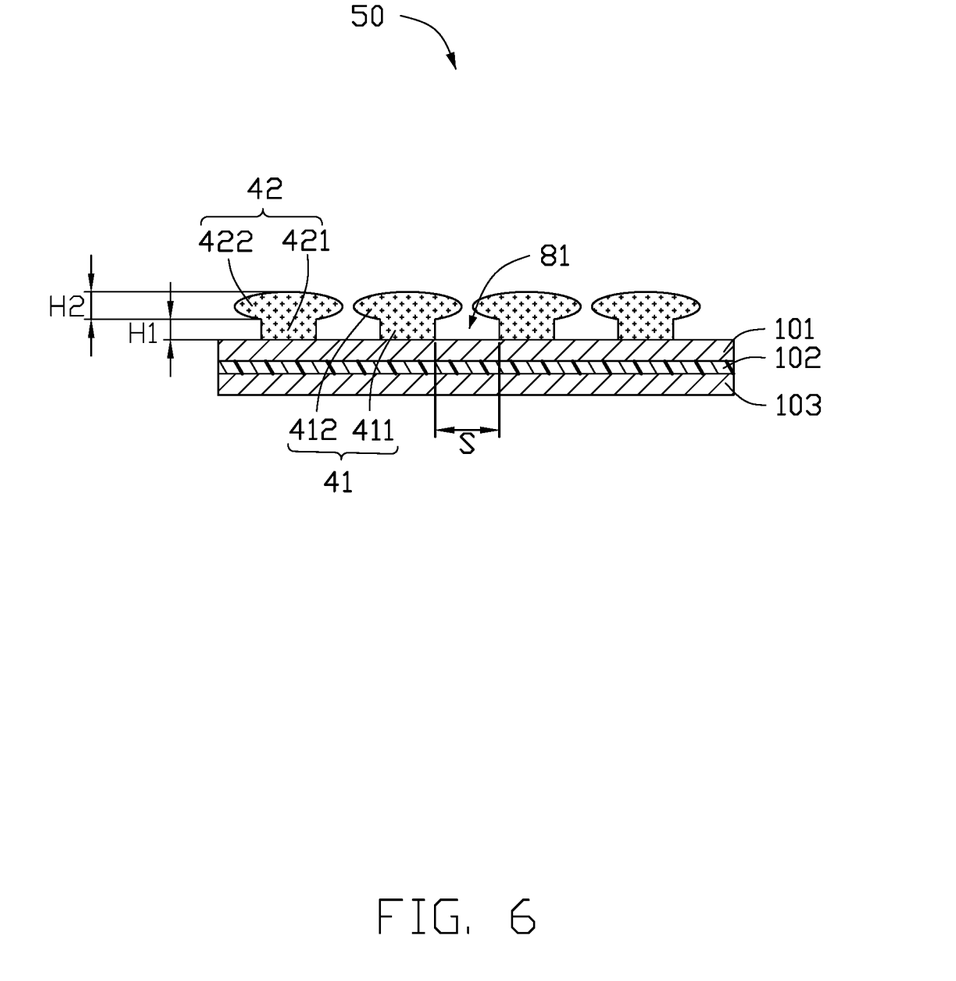
FIG. 6 is a cross-sectional view showing the photoresist layer removed from the copper-clad laminate of FIG. 5 to obtain an intermediate structure.

At block 205, referring to FIG. 6, the photoresist layer 30 is removed to obtain an intermediate structure 50.

In at least one embodiment, any two adjacent of the plurality of thermally conductive bumps 41 and the first copper foil 101 of the intermediate structure 50 are surrounded to form a fluid storage area 81 to store a working fluid 80 (shown in FIG. 8). a width of an end of the fluid storage area 81 connecting the first copper foil 101 is greater than a width of the an end of the fluid storage area 81 facing away from the first copper foil 101, thereby increasing a storage capacity of the working fluid 80.

In at least one embodiment, referring to FIG. 6, a shape of the first cover portion 412 and a shape of the second cover portion 422 may be the same. Both of a cross sectional shape of the first cover portion 412 and a cross sectional shape of the second cover portion 422 along a same direction are elliptical. A height H2 of the second cover portion 422 may be in a range of 10 μm to 40 μm, preferably 15 μm. In another embodiment, each of the cross sectional shape of the first cover portion 412 and the cross sectional shape of the second cover portion 422 along the same direction may be an any shape such as a polygon or a circle. The cross sectional shape of the first cover portion 412 and the cross sectional shape of the second cover portion 422 along the same direction may be different. For example, the cross sectional shape of the first cover portion 412 is a rectangle, the cross sectional shape of the second cover portion 422 is a ellipse.

In at least one embodiment, referring to FIG. 6, a maximum distance S between any two adjacent of the plurality of thermally conductive bumps 41 is in a range of 30 μm to 300 μm, preferably 50 μm.

In at least one embodiment, referring to FIG. 6, a surface roughness Rz of an outer surface of the second cover portion 422 facing away from the second body portion 421 is less than 2 μm. The surface roughness Rz refers to a sum of an average value of the largest profile peak height and an average value of five largest profile valley depths within the sampling length of the outer surface of the second cover portion 422.

Figure 8:
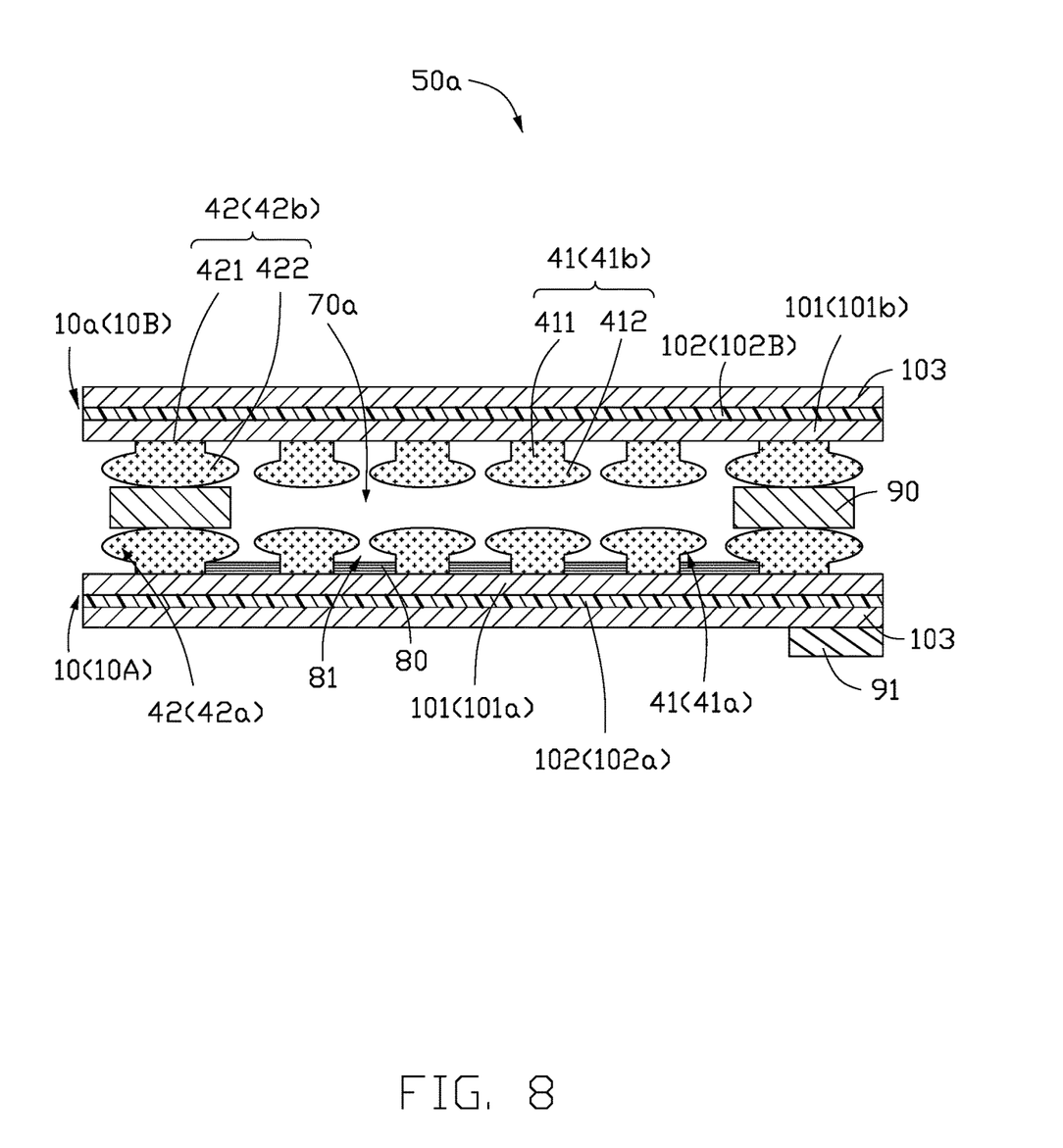
FIG. 8 is a cross-sectional view showing a first embodiment of a heat equalization plate.

At block 206, referring to FIG. 8, two intermediate structures 50 are stacked, and the second cover portion 422 of one of the intermediate structures 50 faces and corresponds to the second cover portion 422 of the other intermediate structure 50 to be connected to each other, thereby forming a sealed chamber 70a between the intermediate structures 50. The working fluid 80 is injected into the fluid storage area 81 after vacuumizing the sealed chamber 70a, thereby obtaining the first heat equalization plate 50a.

In at least one embodiment, when the intermediate structures 50 are stacked, each first cover portion 412 of one of the intermediate structures 50 corresponds to one first cover portion 412 of the other intermediate structure 50. In another embodiment, when the intermediate structures 50 are stacked, a plurality of first cover portions 412 of one of the intermediate structures 50 and a plurality of first cover portions 412 of the other intermediate structure 50 may be staggered.

In at least one embodiment, the second cover portion 422 of one of the intermediate structures 50 and the second cover portion 422 of the other intermediate structure 50 may be welding by a solder portion 90 to be connected to each other. Since the surface roughness of the second cover portion 422 is low (Rz<2 μm), the second cover portion 422 has a good contact strength with the solder portion 90, thereby improving a bonding strength between the intermediate structures 50.

In at least one embodiment, the working fluid 80 may be a low boiling point solvent, such as water, ethanol, or methanol.

Figure 9:
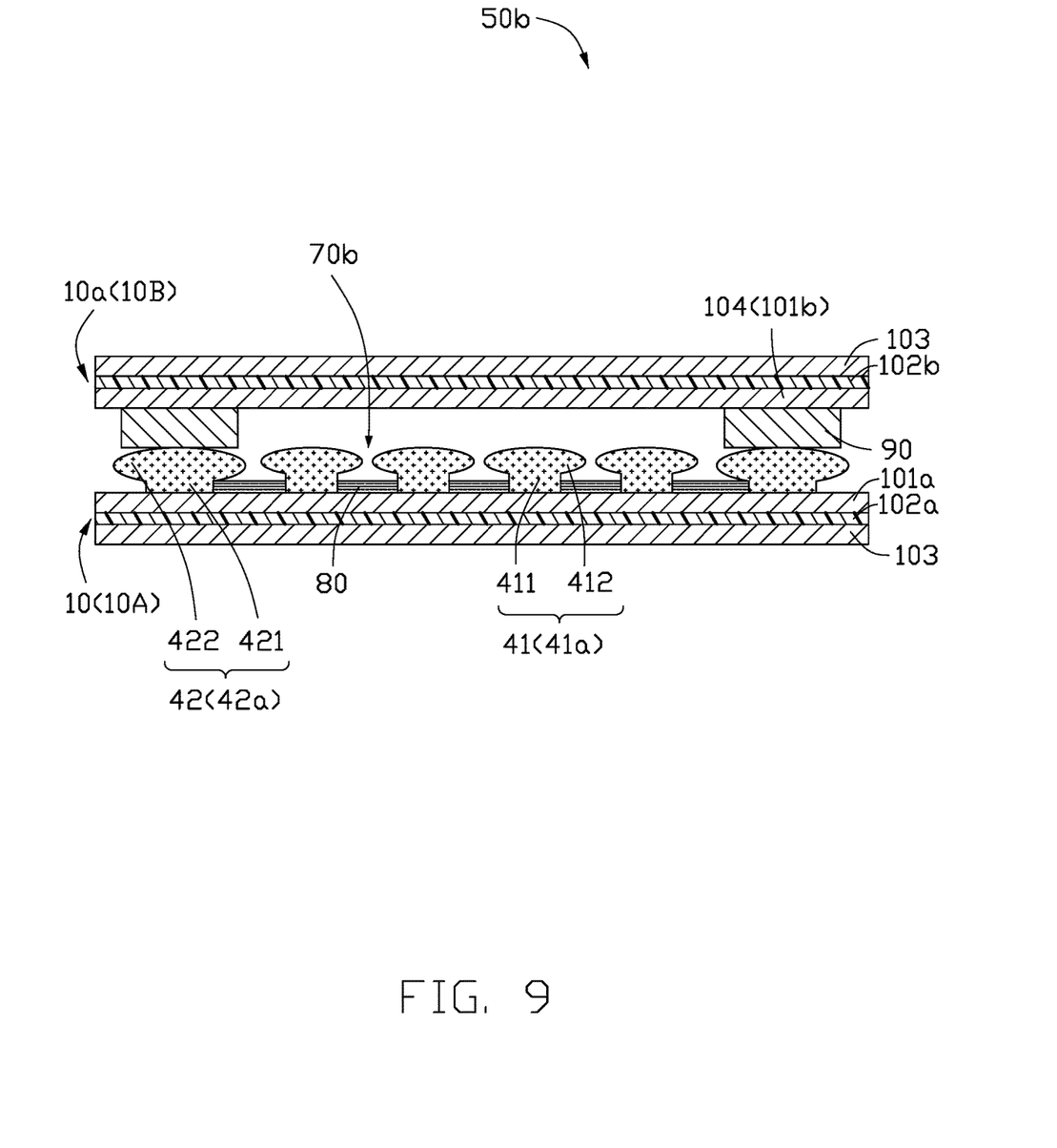
FIG. 9 is a cross-sectional view showing a second embodiment of a heat equalization plate.

In a second embodiment, referring to FIG. 9, the method for manufacturing a second heat equalization plate 50b differs from the first embodiment as described above, the intermediate structure 50 and a copper-clad laminate 10a are stacked, and the second cover portion 422 of the intermediate structure 50 faces a copper foil 104 of the copper-clad laminate 10a to be connected to each other, thereby forming a sealed chamber 70b between the intermediate structure 50 and the copper-clad laminate 10a.

The copper-clad laminate 10a may be a double-sided copper-clad laminate or single-sided copper-clad laminate.

Figure 10:
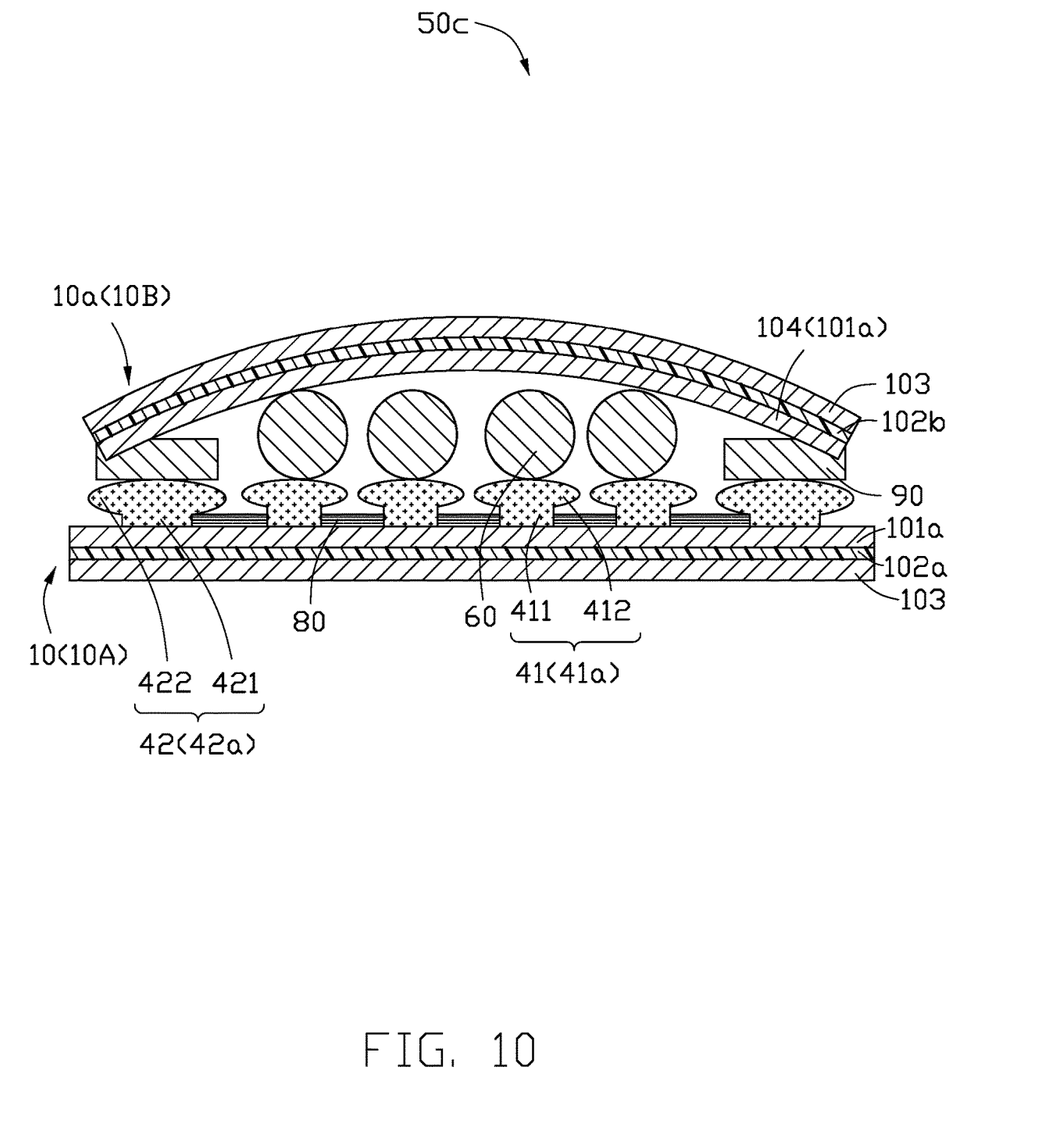
FIG. 10 a cross-sectional view showing a third embodiment of a heat equalization plate.

In a second embodiment, referring to FIG. 10, the method for manufacturing a third heat equalization plate 50c differs from the second embodiment as described above, before stacking the intermediate structure 50 and the copper-clad laminate 10a, at least one capillary structure 60 is formed on a side of the plurality of first cover portion 412 facing away from a plurality of first body portions 411. Each of the at least one capillary structure 60 includes a metal mesh or metal fibers to improve a thermal conductivity rate, thereby improving a heat transfer capacity of the third heat equalization plate 50c. Each of the at least one capillary structure 60 includes a plurality of holes (not shown), the working fluid may be contained in the plurality of holes, thereby further improving a heat transfer capacity of the third heat equalization plate 50c.

In at least one embodiment, the at least one capillary structure 60 is located at a center part of the side of the plurality of first cover portion 412 facing away from the plurality of first body portions 411.

In at least one embodiment, a height of each of at least one capillary structure 60 is larger than a height of the solder portion 90, when the intermediate structure 50 and the copper-clad laminate 10a are stacked, a center part of the copper-clad laminate 10a is recessed in direction away from the intermediate structure 50 to form an arc, a periphery part of the copper-clad laminate 10a is connected to the second cover portion 422 of the intermediate structure 50, thereby increasing a volume of the sealed chamber 70c to receive the working fluid 80.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

FIG. 8 illustrates a first embodiment of a first heat equalization plate 50a. The first heat equalization plate 50a includes a first copper-clad laminate 10A and a second copper-clad laminate 10B stacked on the first copper-clad laminate 10A. The first copper-clad laminate 10A includes a first insulating layer 102a and a first copper foil 101a combined with a side of the first insulating layer 102a. The second copper-clad laminate 10B includes a second insulating layer 102b and a first copper foil 101b combined with a side of the first insulating layer 102b. The first copper foil 101a of the first copper-clad laminate 10A and the first copper foil 101b of the second copper-clad laminate 10B face each other. A plurality of first thermally conductive bumps 41a and a first connecting bump 42a protrude from a surface of the first copper foil 101a of the first copper-clad laminate 10A facing away from the first insulating layer 102a, a plurality of second thermally conductive bumps 41b and a second connecting bump 42b protrude from a surface of the second copper foil 101b of the second copper-clad laminate 10B facing away from the second insulating layer 102b. Any two adjacent of the plurality of first thermally conductive bumps 41a are spaced from each other to form a fluid storage area 81, and any two adjacent of the plurality of second thermally conductive bumps 41b are spaced from each other to form a fluid storage area 81. The first connecting bump 42a is an annulus and surrounds the plurality of first thermally conductive bumps 41a. The second connecting bump 42b is an annulus and surrounds the plurality of second thermally conductive bumps 41b. The first connecting bump 42a and the second connecting bump 42b are connected by a solder portion 90, thereby forming a sealed chamber 70a between the first copper-clad laminate 10A and the second copper-clad laminate 10B. The plurality of first thermally conductive bumps 41a and the plurality of second thermally conductive bumps 41b are received in the sealed chamber 70a.

In at least one embodiment, the plurality of first thermally conductive bumps 41a may be spaced from the plurality of second thermally conductive bumps 41b. Each of the plurality of first thermally conductive bumps 41a may correspond to one of the plurality of second thermally conductive bumps 41b. In another embodiment, the plurality of first thermally conductive bumps 41a and the plurality of second thermally conductive bumps 41b may be staggered. A working fluid 80 is received in the sealed chamber 70a.

In a second embodiment, referring to FIG. 9, a second heat equalization plate 50b differs from the first embodiment as described above, the plurality of second thermally conductive bumps 41b and the second connecting bump 42b are omitted, and the first connecting bump 42a is connected to the first copper foil 101b of the second copper-clad laminate 10B by a solder portion 90, thereby forming a sealed chamber 70b between the first copper-clad laminate 10A and the second copper-clad laminate 10B.

In a third embodiment, referring to FIG. 10, a third heat equalization plate 50c differs from the second embodiment as described above, at least one capillary structure 60 is received in the sealed chamber 70c and arranged on a side of the plurality of first thermally conductive bumps 41a facing away from the first copper-clad laminate 10A. A height of each of at least one capillary structure 60 is larger than a height of the solder portion 90, and a center part of the second copper-clad laminate 10B is recessed in direction away from the first copper-clad laminate 10A to form an arc.

When a heating element 91 (for example a CPU) is arranged on the copper-clad laminate 10(10A), a heat generated by the heating element 91 is transferred to the copper foil 101(101a), and the working fluid 80 attached to the copper foil 101(101a) absorbs the heat and changes from a liquid state to a gaseous state. The gaseous working fluid 80 diffuses to other areas of the sealed chamber 70a, and changes from the gaseous state to liquid state to release the heat, thereby improving the heat dissipation rate.

The above heat equalization plate has the following advantages:

(1) The thermally conductive bumps formed on the copper foil by electroplating may enhance a thermal conductivity between the thermally conductive bumps and the copper foil and reduce a thermal resistance.

(2) The outer surface of the connecting bump formed by electroplating has a lower surface roughness, which is convenient for subsequent welding.

(3) The thermally conductive bumps may accelerate the conduction of heat, which in turn is beneficial to improve a temperature equalization effect.

The above is only the preferred embodiment of the present invention, and does not limit the present invention in any form. Although the present invention has been disclosed as the preferred embodiment, it is not intended to limit the present invention. Any person skilled in the art, without departing from the scope of the technical solution of the present invention, when the technical contents disclosed above can be used to make some changes or modifications to equivalent implementations, if without departing from the technical solution content of the present invention, any simple modifications, equivalent changes and modifications made to the above embodiments based on the technical essence of the present invention still fall within the scope of the technical solution of the present invention.

What is claimed is:

1. A method for manufacturing a heat equalization plate, comprising:

providing a copper-clad laminate comprising a copper foil;

laminating a photoresist layer on a side of the copper foil to cover the copper foil;

exposing and developing the photoresist layer to form an outer opening and a plurality of inner openings to expose a part of the first copper foil, wherein the outer opening is an annulus and surrounds the plurality of inner openings;

forming a thermally conductive bump in each of the plurality of inner openings by electroplating, and forming a connecting bump in the outer opening by electroplating, wherein the connecting bump surrounds a plurality of thermally conductive bumps, each of the plurality of thermally conductive bump and the connecting bump is electrically connected to the copper foil;

removing the photoresist layer to obtain an intermediate structure;

stacking and connecting two intermediate structures to form a sealed chamber and filling a working fluid in the sealed chamber after vacuumizing the sealed chamber, wherein two connecting bumps facing and corresponding to each other are connected, thereby forming the sealed chamber between two intermediate structures.

2. The method of claim 1, wherein before removing the photoresist layer, each of the plurality of thermally conductive bumps comprises a first body portion and a first cover portion, the first body portion fills in one of the plurality of inner openings and is electrically connected to the copper foil, the first cover portion is arranged at a side of the photoresist layer facing away from the copper-clad laminate and electrically connected to a side of the first body portion facing away from the first copper foil, a width of the first cover portion is greater than a width of the first body portion to cover the whole side of the first body portion and a portion of the photoresist layer around the first body portion.

3. The method of claim 2, wherein before removing the photoresist layer, the connecting bump comprises a second body portion and a second cover portion, the second body portion fills in the outer opening and is electrically connected to the copper foil, the second cover portion is arranged at a side of the photoresist layer facing away from the copper-clad laminate and electrically connected to a side of the second body portion facing away from the copper foil, a width of the second cover portion is greater than a width of the second body portion to cover the whole side of the second body portion and a portion of the photoresist layer around the second body portion.

4. The method of claim 3, wherein the first body portion and the second body portion have the same height, and the first body portion is flush with the photoresist layer.

5. The method of claim 3, wherein an outer surface of the second cover portion has a surface roughness less than 2 μm.

6. The method of claim 3, wherein a maximum distance between any two adjacent of the plurality of thermally conductive bumps is in a range of 30 μm to 300 μm.

7. A method for manufacturing a heat equalization plate, comprising:

providing a first copper-clad laminate comprising a copper foil;

laminating a photoresist layer on a side of the copper foil to cover the copper foil;

exposing and developing the photoresist layer to form an outer opening and a plurality of inner openings to expose a part of the first copper foil, wherein the outer opening is an annulus and surrounds the plurality of inner openings;

forming a thermally conductive bump in each of the plurality of inner openings by electroplating, and forming a connecting bump in the outer opening by electroplating, wherein the connecting bump surrounds a plurality of thermally conductive bumps, each of the plurality of thermally conductive bump and the connecting bump is electrically connected to the copper foil;

removing the photoresist layer to obtain an intermediate structure;

stacking and connecting the intermediate structure and a second copper-clad laminate comprising a copper foil to form a sealed chamber, and filling a working fluid in the sealed chamber after vacuumizing the sealed chamber, wherein the connecting bump faces the copper foil of the second copper-clad laminate, and the connecting bump is connected to the copper foil of the second copper-clad laminate, thereby forming the sealed chamber between the intermediate structure and the second copper-clad laminate.

8. The method of claim 7, wherein before removing the photoresist layer, each of the plurality of thermally conductive bumps comprises a first body portion and a first cover portion, the first body portion fills in one of the plurality of inner openings and is electrically connected to the copper foil, the first cover portion is arranged at a side of the photoresist layer facing away from the copper-clad laminate and electrically connected to a side of the first body portion facing away from the first copper foil, a width of the first cover portion is greater than a width of the first body portion to cover the whole side of the first body portion and a portion of the photoresist layer around the first body portion.

9. The method of claim 8, wherein before removing the photoresist layer, the connecting bump comprises a second body portion and a second cover portion, the second body portion fills in the outer opening and is electrically connected to the copper foil, the second cover portion is arranged at a side of the photoresist layer facing away from the copper-clad laminate and electrically connected to a side of the second body portion facing away from the copper foil, a width of the second cover portion is greater than a width of the second body portion to cover the whole side of the second body portion and a portion of the photoresist layer around the second body portion.

10. The method of claim 9, wherein the first body portion and the second body portion have the same height, and the first body portion is flush with the photoresist layer.

11. The method of claim 9, wherein an outer surface of the second cover portion has a surface roughness less than 2 μm.

12. The method of claim 9, wherein a maximum distance between any two adjacent of the plurality of thermally conductive bumps is in a range of 30 μm to 300 μm.

13. The method of claim 9, wherein before stacking and connecting the intermediate structure and the second copper-clad laminate to form a sealed chamber and filling the working fluid in the sealed chamber after vacuumizing the sealed chamber, the method further comprising:

forming at least one capillary structure on a side of the plurality of thermally conductive bumps facing away from the first copper-clad laminate;

wherein after stacking and connecting the intermediate structure and the second copper-clad laminate to form a sealed chamber, the at least one capillary structure is received in the sealed chamber.

* * * * *